Figure 1:
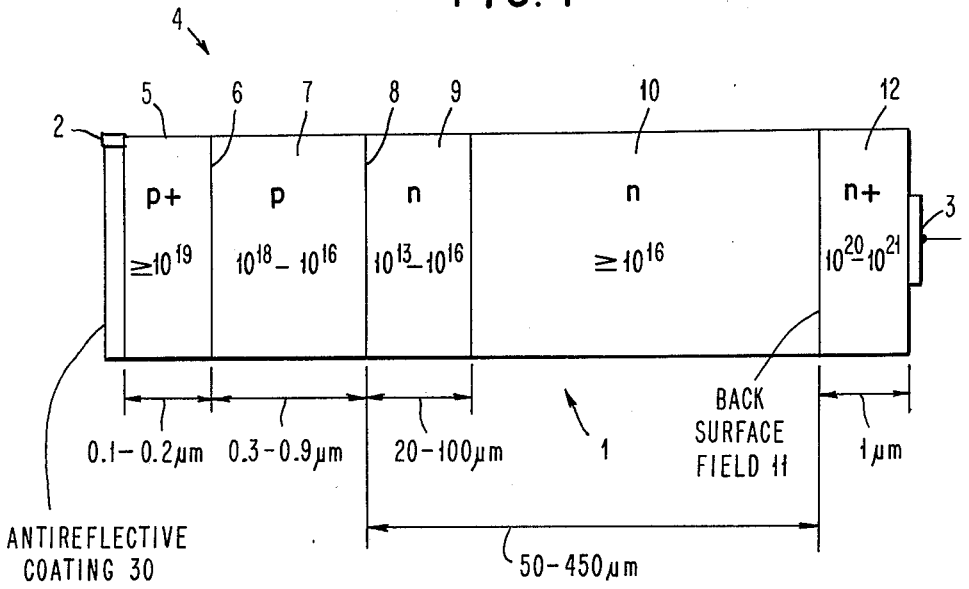
Figure 2:
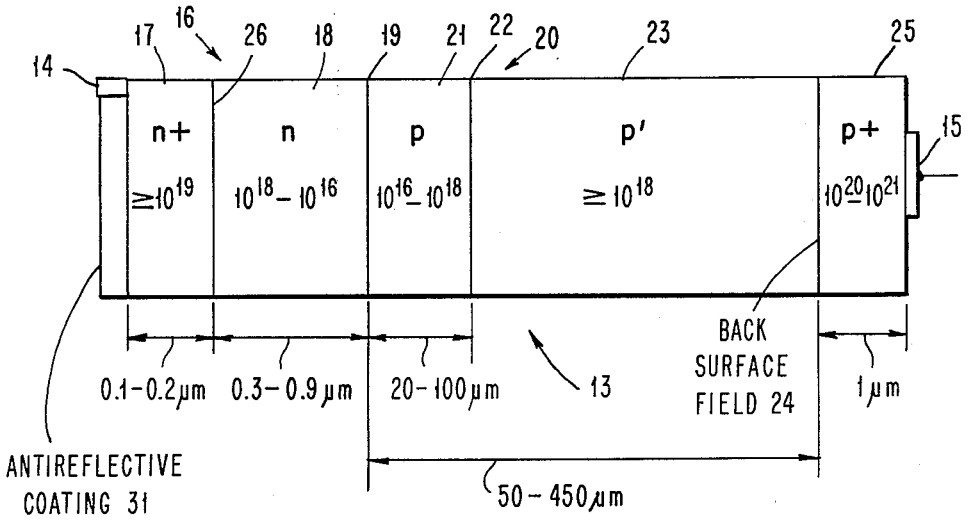

United States Defensive Publication [19] (H) [11] T102,801

Hovel [43] Mar. 1, 1983

[54] SILICON SOLAR CELL

[76] Inventor: Harold J. Hovel, Diane Ct., Katonah, N.Y. 10598

[21] Appl. No.: 412,424

[22] Filed: Aug. 30, 1982

Related U.S. Application Data

[63] Continuation of Ser. No. 229,367, Jan. 29, 1981, abandoned, which is a continuation-in-part of Ser. No. 968,888, Dec. 13, 1978, abandoned, which is a continuation of Ser. No. 101,964, Dec. 10, 1979, abandoned.

[51] Int. Cl.[3] ..... H01L 31/06

[52] U.S. Cl. ..... 136/255; 357/30

[57] ABSTRACT

A high efficiency silicon solar cell (1) may be constructed by providing a two-stage drift field emitter (4) with a 1 micron thickness on a drift field base region (10) with a back surface field region (12). The stage (7) of the drift field emitter adjacent to the junction (8) is moderately doped from $10^{18}$ to $10^{16}$ atoms/cc adjacent the junction to minimize bandgap shrinkage and to maximize carrier lifetime while the stage of the emitter adjacent the surface is highly doped at $10^{19}$ atoms/cc to minimize sheet resistance. The drift field is aiding in both the emitter and base regions. The size of the base (10) is less than an effective diffusion length. There is a difference in doping level in the base depending on the conductivity type of the silicon. For n-conductivity type the base is doped $10^{13}$ atoms/cc at the pn junction, increasing to $10^{16}$ atoms/cc in the drift field region. For p-conductivity type the base is doped $10^{16}$ at the junction, increasing to $10^{18}$ atoms/cc in the drift field. A back surface field is provided adjacent the ohmic contact (3) on the part of the base remote from the junction by doping to $10^{20}$ to $10^{21}$ atoms/cc. A passivating antireflective layer (30) is added to the light incident surface. The 1 micron emitter region (4) contains a 0.1 to 0.2 μm thick high conducting region (5) adjacent the antireflective coating (30) on the light incident surface and a drift field region (7) 0.3 to 0.9 μm thick. The base region (10) has a drift field region (9) 20 to 100 μm thick and the overall base region (10) is 50 to 450 μm thick. The back surface field region (12) is 1 μm thick.

4 Claims, 1 Sheet Drawing,

22 Pages Specification

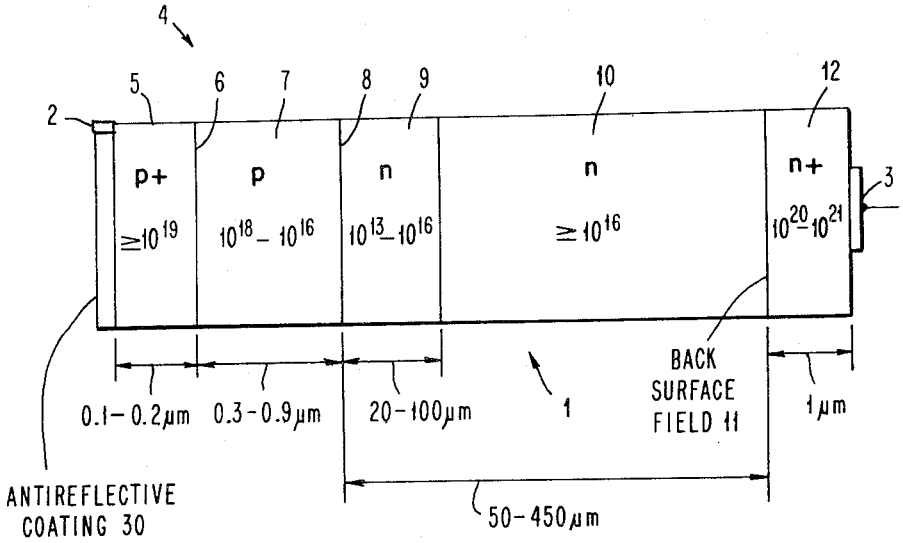

The file of this unexamined application may be inspected and copies thereof may be purchased (849 O.G. 1221, Apr. 9, 1968).